(12) United States Patent
Lee et al.

(10) Patent No.: US 8,456,909 B2
(45) Date of Patent: Jun. 4, 2013

(54) NONVOLATILE MEMORY DEVICE AND METHOD FOR FABRICATING THE SAME

(75) Inventors: Ki-Hong Lee, Gyeonggi-do (KR);
Kwon Hong, Gyeonggi-do (KR);
Min-Soo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/308,972

(22) Filed: Dec. 1, 2011

(65) Prior Publication Data

US 2012/0170368 A1    Jul. 5, 2012

(30) Foreign Application Priority Data

Dec. 31, 2010    (KR) ........................ 10-2010-0140510

(51) Int. Cl.
*G11C 16/04*    (2006.01)

(52) U.S. Cl.
USPC ............. 365/185.05; 365/185.11; 365/185.17

(58) Field of Classification Search
USPC .................. 257/315, 324, 295, 202; 365/185, 365/185.05, 185.11, 185.17
See application file for complete search history.

(56) References Cited

U.S. PATENT DOCUMENTS

| | | | | |
|---|---|---|---|---|
| 2008/0006869 A1* | 1/2008 | Kamigaichi et al. | .......... | 257/315 |
| 2008/0173932 A1* | 7/2008 | Kidoh et al. | .................. | 257/324 |

FOREIGN PATENT DOCUMENTS

| | | |
|---|---|---|
| JP | 2008-171918 | 7/2008 |
| JP | 2009-238874 | 10/2009 |
| JP | 2010-045149 | 2/2010 |
| KR | 1020100063634 | 6/2010 |

OTHER PUBLICATIONS

Notice of Allowance issued by the Korean Intellectual Property Office on Jan. 20, 2012.

\* cited by examiner

*Primary Examiner* — Hoai V Ho
(74) *Attorney, Agent, or Firm* — IP & T Group LLP

(57) ABSTRACT

Provided are a nonvolatile memory device and a method for fabricating the same, which can secure the structural stability of a three-dimensional nonvolatile memory device. The nonvolatile memory device includes one or more columnar channel plugs, a plurality of word lines and a plurality of dielectric layers stacked alternately to surround the columnar channel plug, a memory layer disposed between the word line and the columnar channel plug, a plurality of word line connection portions, each of the word line connection portions connecting ends of word lines of a common layer from among the plurality of word lines, and a plurality of word line extension portions extending from the word line connection portions.

16 Claims, 30 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2010-0140510, filed on Dec. 31, 2010, which is incorporated herein by reference in its entirety.

BACKGROUND

1. Field of the Invention

Exemplary embodiments of the present invention relate to a semiconductor device and a method for fabricating the same, and more particularly, to a nonvolatile memory device and a method for fabricating the same.

2. Description of the Related Art

In order to use a word line as a metal in a three-dimensional flash device, after a channel plug is formed as in Terabit Cell Array Transistors (TCAT), a sacrificial layer is stripped and an oxide/nitride/oxide (ONO) layer and a metal are deposited thereon. Thereafter, a word line is formed through an isolation process.

FIG. 1A is a perspective view of a conventional nonvolatile memory device. FIG. 1B is a layout view of FIG. 1A.

Referring to FIGS. 1A and 1B, a plurality of channel plugs 11 is formed on a substrate (not illustrated). Each of the channel plugs 11 pierces a word line 12. A plurality of word lines 12 are stacked in a plurality of layers. Both ends of the word lines 12 are trimmed in a trimmed region 13 to have a stepwise configuration. The word lines 12 have a stepwise configuration in which the uppermost word line 12 is shortest and the lowermost word line 12 is longest. That is, the word lines 12 are stacked and form rows extending across a cell region 100. However, once outside the cell region 100, the word lines 12 are trimmed to form the stepwise configuration, and the ends of the word lines 12 are connected to word line contacts 14.

Thus, the trimmed region 13 is a region in which the word line contacts 14 are connected. The trimmed region 13 generally has a width of approximately 500 nm.

The conventional technology of FIGS. 1A and 1B alternately stacks dielectric layers and sacrificial layers several times, selectively removes the sacrificial layers, and forms the word lines 12 in the portions cleared of the sacrificial layers. For example, in a 128-giga class flash memory, dielectric layers and sacrificial layers are stacked in 16 layers. For example, the dielectric layers may be formed using oxide, and the sacrificial layers may be formed using nitride. In this structure, in the case of the lowermost word line 12, an approximately 9000 nm (=16×500 nm) empty space from a trimming start region 101 to a trimming end region 102 must be supported by a dielectric layer (e.g., an oxide layer).

However, there is a high probability that the trimming region collapses due to a thermal stress in the sacrificial layer (nitride layer) stripping process and the subsequent ONO process. Consequently, the word lines 12 are not properly formed, thus making it difficult to form the device.

SUMMARY

Exemplary embodiments of the present invention are directed to a nonvolatile memory device and a method for fabricating the same, which can secure the structural stability of a three-dimensional nonvolatile memory device.

In accordance with an exemplary embodiment of the present invention, a nonvolatile memory device includes one or more columnar channel plugs, a plurality of word lines and a plurality of dielectric layers stacked alternately to surround the columnar channel plug, a memory layer disposed between the word line and the columnar channel plug, a plurality of word line connection portions, each of the word line connection portions connecting ends of word lines of a common layer from among the plurality of word lines, and a plurality of word line extension portions extending from the word line connection portions. The word line extension portions may be formed in a stepwise configuration. The word line extension portion may extend in one direction from an approximately center portion of a respective one of the word line connection portions. The word line extension portions may extend from both edges of the word line connection portions. The word line extension portion may extend in an oblique direction from one edge of the word line connection portions. The word line connection portions and the word line extension portions may include a first word line connection portion connecting the ends of some of the word lines, a plurality of first word line extension portions extending in an oblique direction from the first word line connection portion and having a stepwise configuration, a second word line connection portion connecting the ends of the other word lines, and a plurality of second word line extension portions extending in an oblique direction from the second word line connection portion and having a stepwise configuration.

In accordance with another exemplary embodiment of the present invention, a method for fabricating a nonvolatile memory device includes forming one or more channel plugs piercing an alternate stack body of a plurality of dielectric layers and a plurality of sacrificial layers, trimming one end of the alternate stack body to form a plurality of step structures, forming a first slit dividing the alternate stack body into memory string units and a second slit dividing the step structures, selectively removing the sacrificial layer to form undercuts, and forming word lines in the undercuts, word line connection portions to connect ends of the word lines, and one or more word line extension portions extending from the word line connection portion to form a stepwise configuration.

DETAILED DESCRIPTION

Figure 1A:
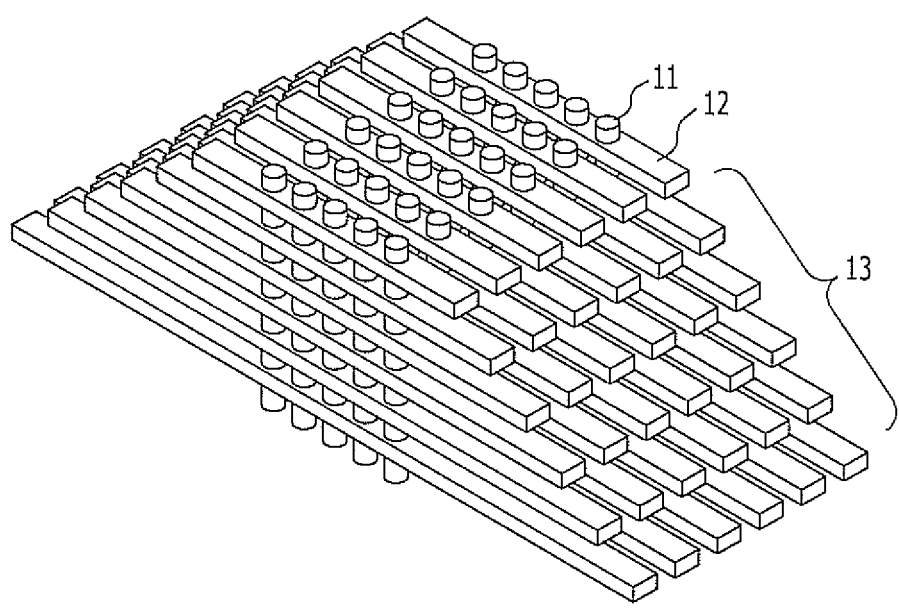
FIG. 1A is a perspective view of a conventional nonvolatile memory device.
Figure 1B:
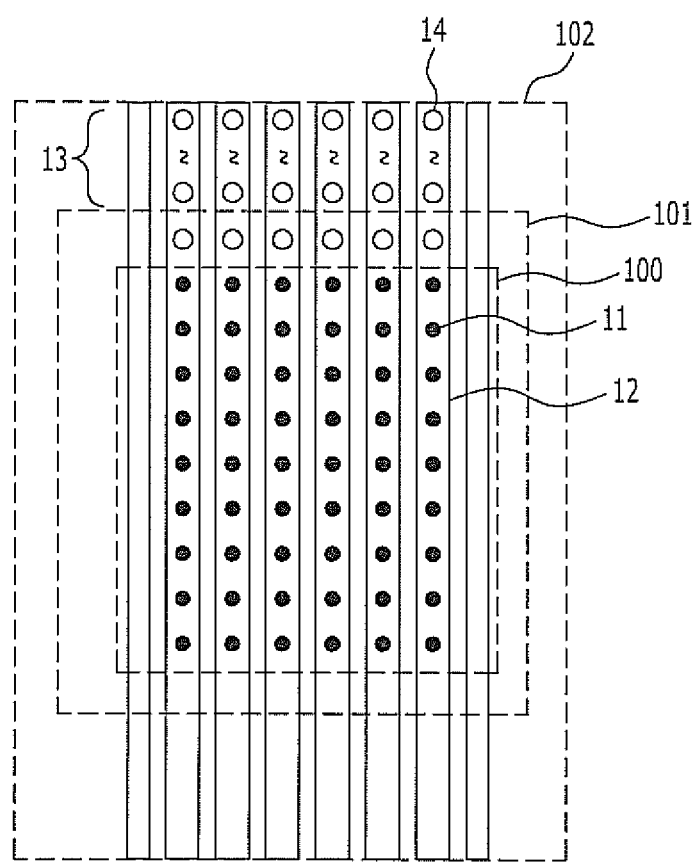
FIG. 1B is a layout view of FIG. 1A.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 2A:
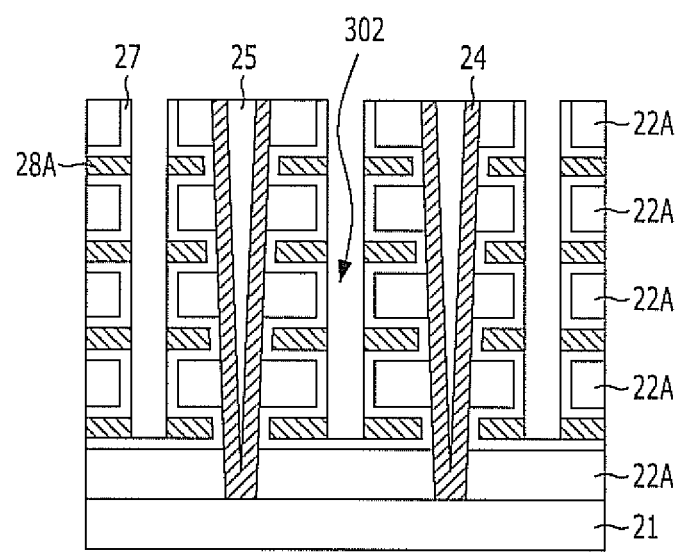
FIG. 2A is a cross-sectional view of a nonvolatile memory device in accordance with a first exemplary embodiment of the present invention.
Figure 2B:
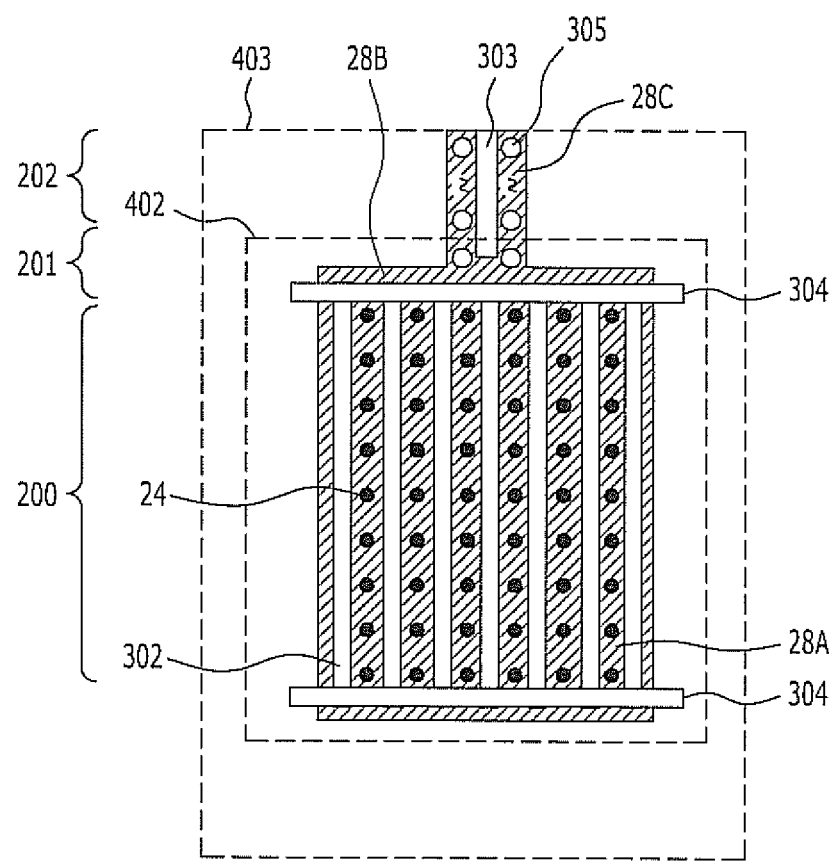
FIG. 2B is a layout view of FIG. 2A.

FIG. 2A is a cross-sectional view of a nonvolatile memory device in accordance with a first exemplary embodiment of the present invention. FIG. 2B is a layout view of FIG. 2A.

Figure 2C:
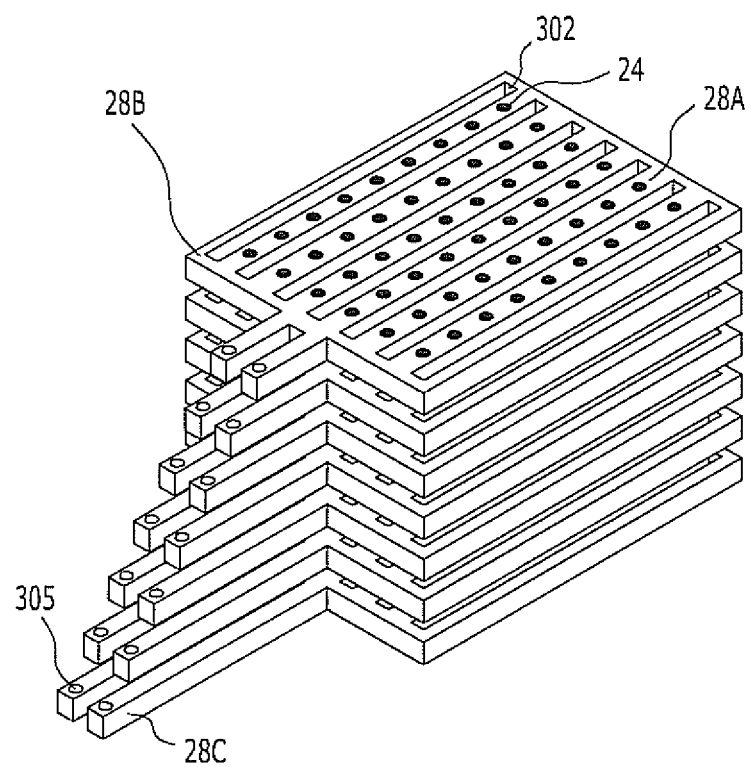
FIG. 2C is a perspective view of a word line and a word line extension portion.
Figure 2D:
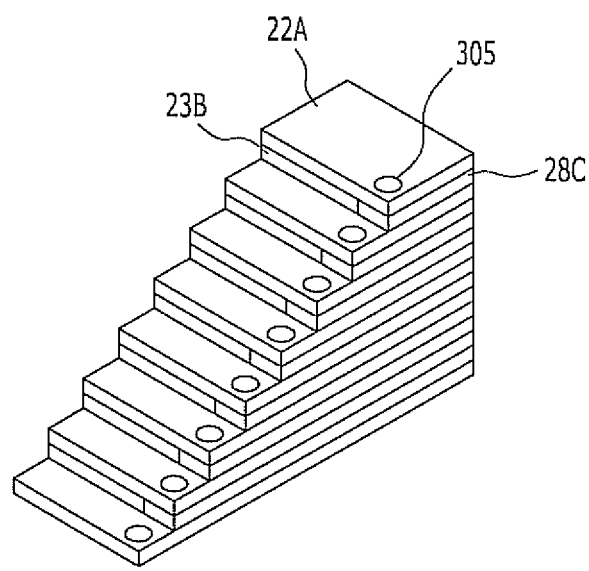
FIG. 2D is a perspective view of a trimming region including the word line extension portion.

FIG. 2C is a perspective view of a word line and a word line extension portion. FIG. 2D is a perspective view of a trimming region including the word line extension portion.

Referring to FIGS. 2A to 2D, a plurality of columnar channel plugs 24 are formed on a substrate 21. A plurality of word lines 28A surrounding the channel plugs 24 are formed in a plurality of layers that are stacked in a vertical direction, and a memory layer 27 is formed between the word lines 28A and the channel plugs 24. A word line connection portion 28B is formed to connect the ends of the word lines 28A formed in the same layer. A plurality of word line extension portions 28C are formed to extend in one direction from the word line connection portions 28B. The word line extension portions 28C are provided in each layer of the word lines 28A. The word line extension portions 28C have variable lengths, which increase from an upper layer to the lower layer to provide a stepwise configuration. Also, as shown in FIG. 2C, more than one word line extension portions 28C may be formed in the same layer. For isolation between the word lines 28A formed in the vertical direction, a plurality of dielectric layers 22A are formed to surround the channel plugs 24. The word lines 28A fill undercuts between the dielectric layers 22A. A plurality of support layers 23B are formed between the dielectric layers to contact the word line extension portions 28C. The word lines 28A, the word line connection portions 28B, and the word line extension portions 28C are formed of the same conductive layer to form one congruent body. Herein, the conductive layer may include a metal. The word lines 28A formed in the same layer are isolated by a slit 302. The dielectric layer 22A may be formed of an oxide layer, and the support layer 23B may be formed of a nitride layer.

Word line contacts 305 are disposed on the word line extension portions 28C of each layer. The word line contacts 305 pierce the dielectric layers 22A to connect to the respective word line extension portions 28C.

Referring to FIGS. 2A to 2D, a plurality of word lines 28A extending in a row direction are arranged in a column direction at predetermined intervals. Layers of the word lines 28A are stacked sequentially from the lowermost layer. The word lines 28A of one layer are connected by the respective word line connection portions 28B. The length of the word line extension portions 28C decreases from the lowermost layer to the uppermost layer. That is, the ends of the word line extension portions 28C are trimmed to provide a stepwise configuration.

According to the first exemplary embodiment of the present invention, in the forming of the word lines 28A, the word lines 28A are completely isolated in a cell region 200 and a select transistor channel hole region 201 having a channel hole of a select transistor, and it is isolated from the word lines 28A of the cell region 200 in a trimming region 202. The word lines 28A formed in the trimming region 202 become the word line extension portions 28C extending from the word line connection portions 28B connecting the ends of the word lines 28A arranged in the column direction. Accordingly, the number of the word line extension portions 28C formed in the trimming region 202 may be smaller than the number of the word lines in the cell region 200. Herein, the word line extension portions 28C formed in the trimming region 202 serve as a connection line that connects a metal interconnection and the word lines 28A of the cell region 200. In the conventional art, a pattern collapse may occur in the trimming region after the stripping of the sacrificial layer. If the present invention uses a replacement process as in TCAT (Terabit Cell Array Transistors), the lines of two regions have a layout to overlap nitride layers stripped on a replacement pattern for forming a word line in order to electrically connect the word lines 28A of the cell region 200 and the word line extension portions 28C formed in the trimming region 202.

Consequently, according to the first exemplary embodiment of the present invention, it is possible to strip the nitride layer of the trimming region 202, which is vulnerable to collapse, only as much as is needed, after the stripping of the sacrificial layer. Accordingly, because the remaining nitride layer is used as the support layer 23B, a pattern collapse is less likely to occur.

Also, in the case of the first exemplary embodiment of the present invention, because it is possible to increase the width of the word line extension portions 28C more than the interval between the word lines 28A formed in the cell region 200, it is also advantageous in terms of the pattern alignment with the word line contacts 305.

Due to the characteristics of a replacement process, the word line extension portions 28C formed in the trimming region 202 may have two lines for one connection slit and the number of lines may increase to avoid a pattern collapse.

Figure 4A:
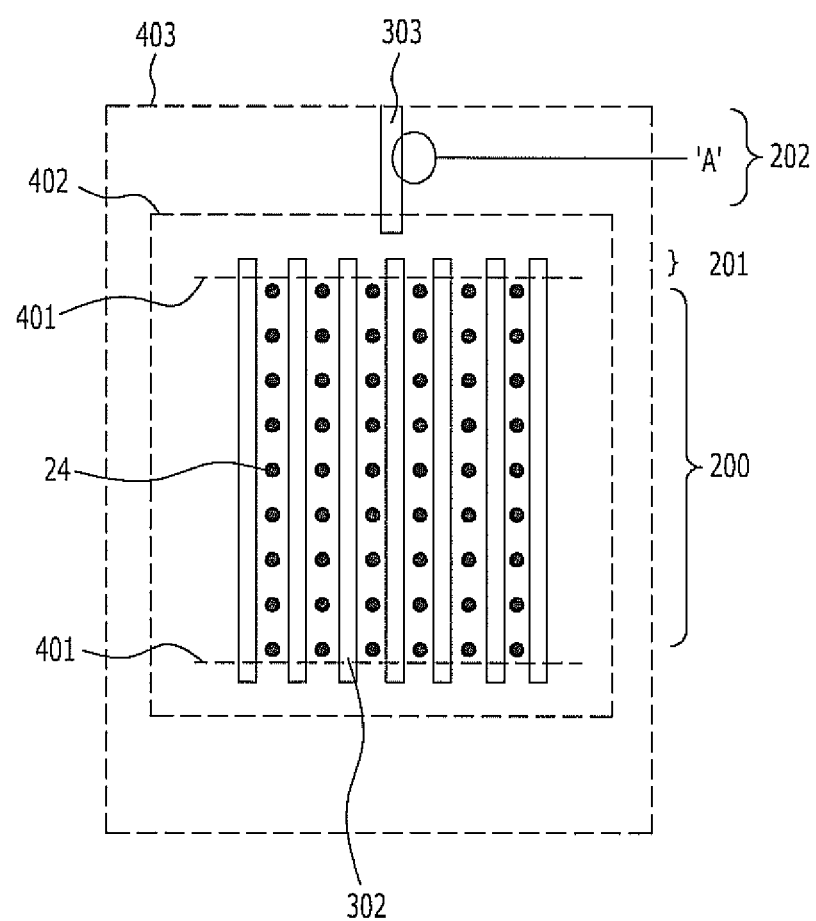
FIG. 4A is a layout view of forming a connection slit.
Figure 4B:
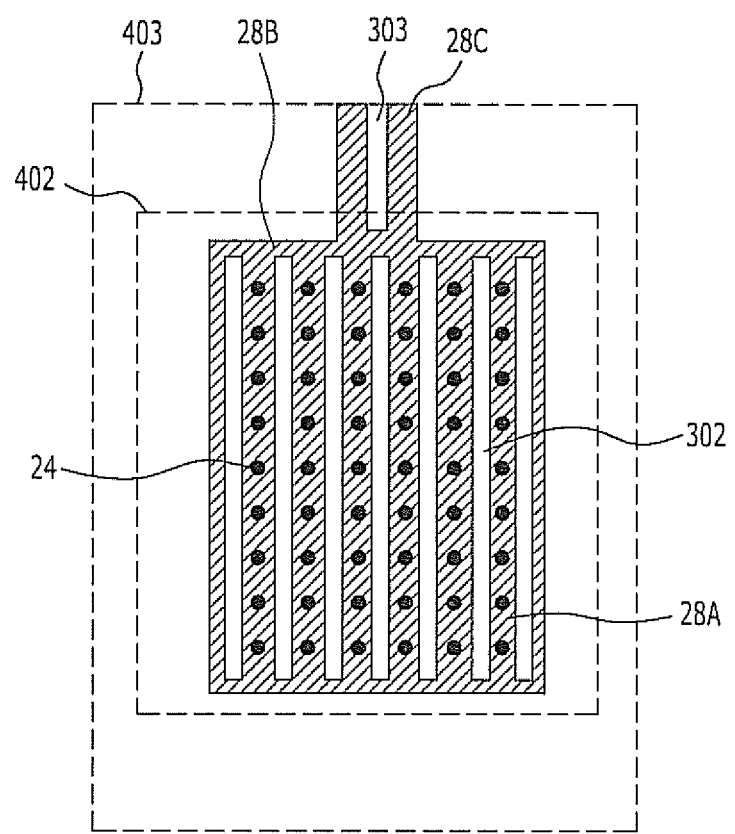
FIG. 4B is a layout view of forming a word line and a word line extension portion.
Figure 4C:
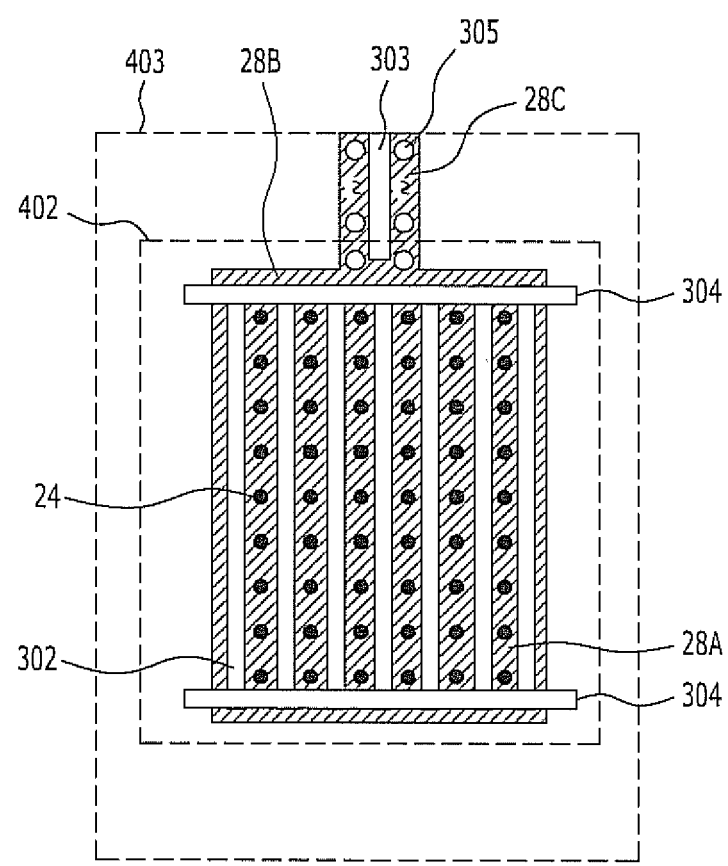
FIG. 4C is a layout view of forming a word line contact.
Figure 5A:
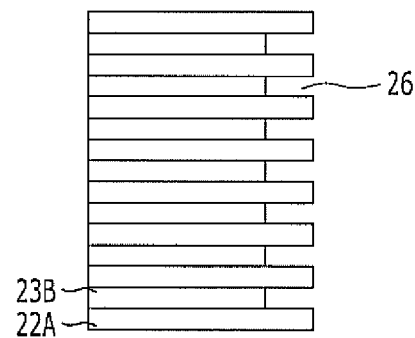
FIGS. 5A and 5B are respectively a cross-sectional view and a perspective view of forming an undercut.
Figure 5B:
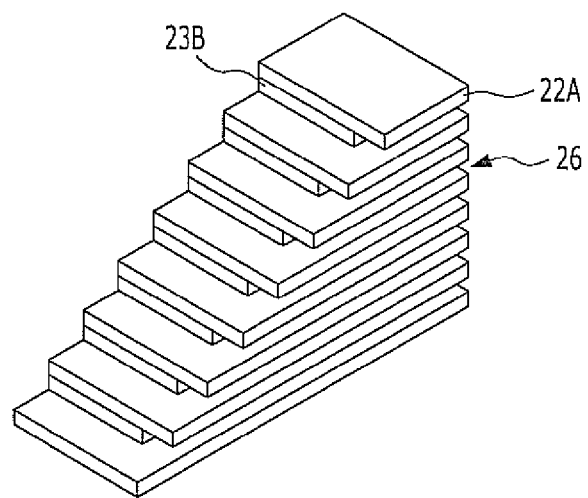
Figure 6A:
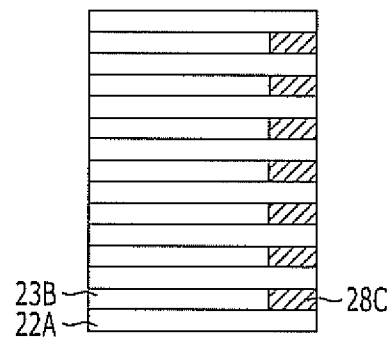
FIGS. 6A and 6B are respectively a cross-sectional view and a perspective view of forming a word line extension portion.
Figure 6B:
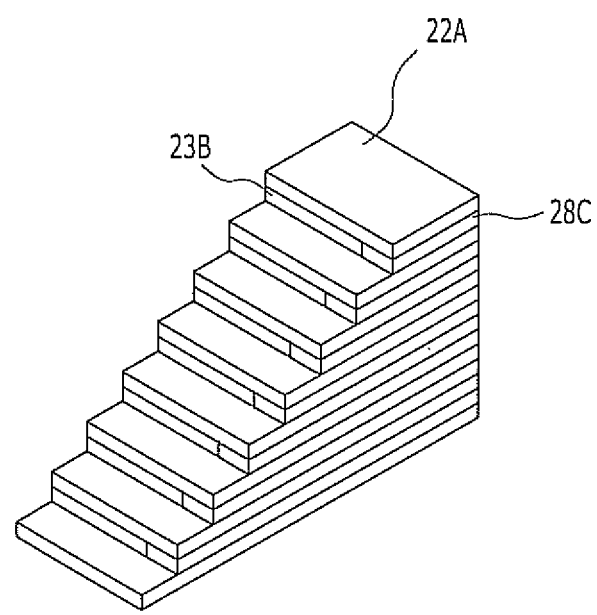
Figure 6C:
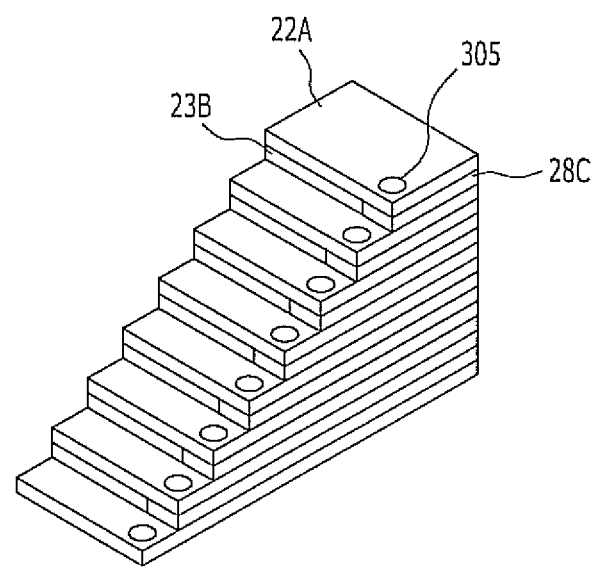
FIG. 6C is a perspective view of forming a word line contact.

FIGS. 3A to 3G are cross-sectional views illustrating a method for fabricating a nonvolatile memory device in accordance with the first exemplary embodiment of the present invention. FIG. 4A is a layout view of forming a connection slit. FIG. 4B is a layout view of forming a word line and a word line extension portion. FIG. 4C is a layout view of forming a word line contact. FIGS. 5A and 5B are a cross-sectional view and a perspective view, respectively, showing a method of forming an undercut. FIGS. 6A and 6B are a cross-sectional view and a perspective view, respectively, showing a method of forming a word line extension portion. FIG. 6C is a perspective view of forming a word line contact. FIGS. 5A and 5B and FIGS. 6A to 6C are detailed views of a portion A of FIG. 4A.

Figure 3A:
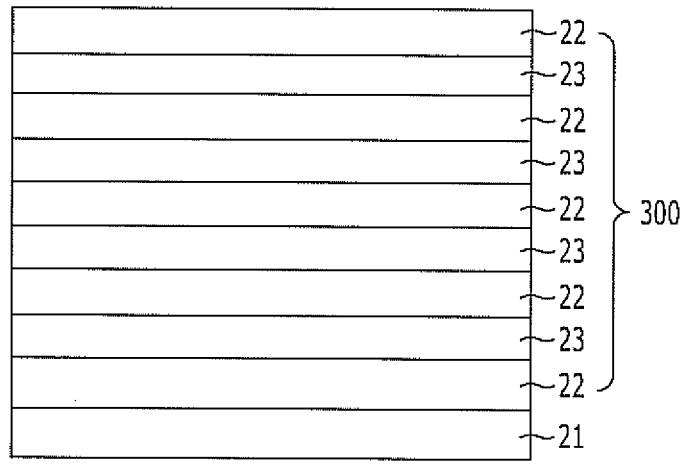
FIGS. 3A to 3G are cross-sectional views illustrating a method for fabricating a nonvolatile memory device in accordance with the first exemplary embodiment of the present invention.

Referring to FIG. 3A, dielectric layers 22 and sacrificial layers 23 are alternately stacked to form a stack body 300 on a substrate 21. The sacrificial layers 23 may include a nitride layer such as a silicon nitride layer. The uppermost layer and the lowermost layer of the stack body 300 are formed of the dielectric layers 22. The dielectric layers 22 are used as a dielectric layer between the word lines, and may comprise an oxide layer such as a silicon oxide layer. The sacrificial layers 23 and the dielectric layers 22 are formed alternately according to the number of memory cells to be stacked. For the convenience of description, the first exemplary embodiment of the present invention illustrates a case where four memory cells are stacked in one memory string.

Figure 3B:
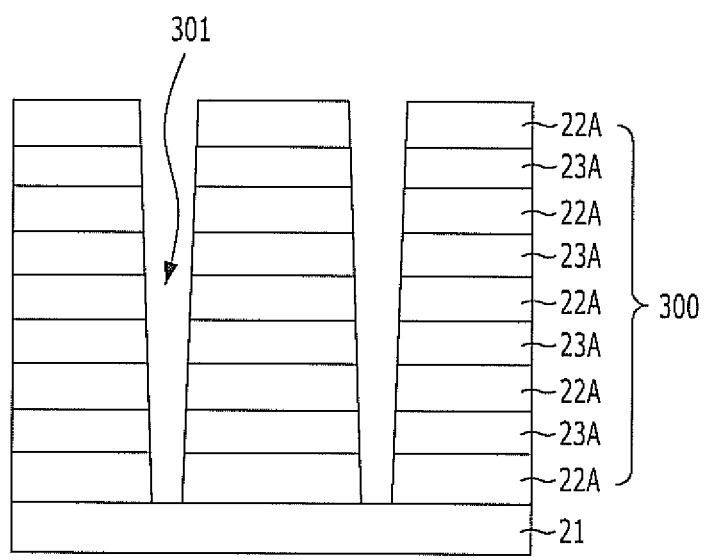

Referring to FIG. 3B, through a trimming etch process, one end of the stack body 300 is formed in a stepwise configuration. Herein, one end of the stack body 300 is a trimming region, that is, a region except a cell region and a select transistor region. A word line contact is formed in the trimming region. The trimming region has a trimming start region and a trimming end region. The trimming etch process may be performed before a slit etching process.

The stack body 300 is etched to form a plurality of channel holes 301 exposing the surface of the substrate 21. That is, the channel holes 301 are formed by performing an etching process that perforates the stack body 300 to expose the substrate 21. As a result of forming the channel holes 301 in the stack body 300, dielectric patterns 22A and sacrificial patterns 23A are formed.

Figure 3C:
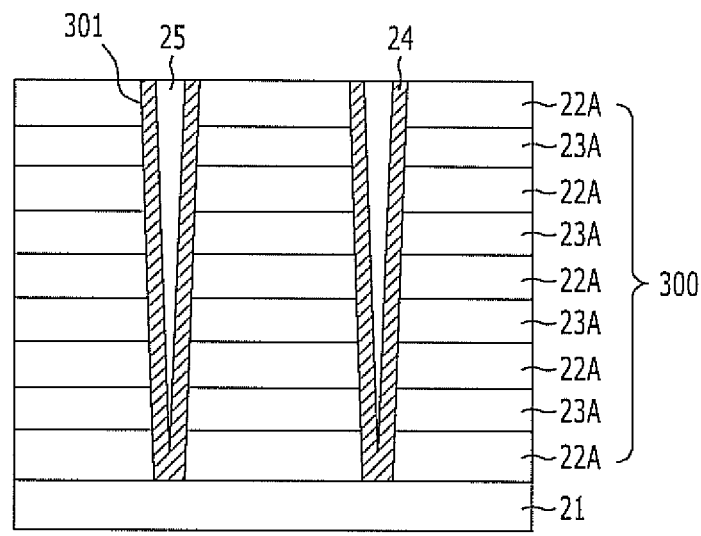

Referring to FIG. 3C, channel plugs 24 and gap-fill layers 25 are formed in the channel holes 301. A first conductive layer serving as the channel plugs 24 is formed on the entire surface of the stack body 300 including the channel holes 301, and the resulting structure is planarized through, for example, a chemical mechanical polishing (CMP) process. The first conductive layer includes a polysilicon layer (e.g., an undoped polysilicon layer). If the first conductive layer does not fill each of the channel holes 301, the gap-fill layer 25 may be formed. Thus, the gap-fill layer 25 is also planarized in the CMP process and is left only in the channel holes 301.

Due to the planarization process, a columnar channel plug 24 is formed in each of the channel holes 301.

Figure 3D:
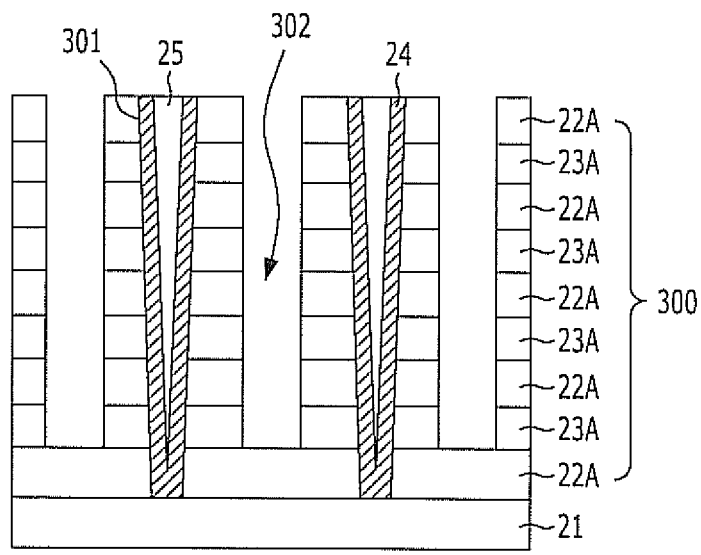

Referring to FIG. 3D, a slit etching process is performed to form a word line isolation slit 302. The word line isolation slit 302 serves to divide the stack body 300 and the channel plugs 24 into memory string units. The bottom of the word line isolation slit 302 reaches the dielectric pattern 22A of the lowermost layer.

The slit etching process for forming the word line isolation slit 302 may be stopped after etching through the sacrificial pattern 23A of the lowermost layer formed of a nitride layer. Accordingly, damage to the substrate 21 is prevented.

While forming the word line isolation slit 302, an etching process for forming a connection line may be performed simultaneously. Accordingly, a connection slit 303 is formed in a trimming region, that is, a region except the cell region and the select transistor region (refer to FIG. 4A).

The word line isolation slit 302 and the connection slit 303 are line-type trench patterns as shown in the plan view of FIG. 4A.

The start point and the end point of the word line isolation slit 302 are formed at points between the edge of a select transistor region 401 and a trimming start region 402 (i.e., a region including the uppermost word line contact). That is, the ends of the word line isolation slits 302 are between the edge of the select transistor region 401 and the trimming start region 402.

The connection slit 303 is formed to extend from a trimming end region 403 (i.e., a region including the lowermost word line contact) to a point between the edge of the select transistor region 401 and the trimming start region 402 (i.e., a region including the uppermost word line contact). The connection slit 303 has two ends. One end of the connection slit 303 defines the trimming end region 403, and the other end of the connection slit 303 extends to a point between the edge of the select transistor region 401 and the trimming start region 402.

The word line isolation slit 302 and the connection slit 303 extend in the same direction. The word line isolation slit 302 may be longer than the connection slit 303. The width of the word line isolation slit 302 may be equal to or smaller than the width of the connection slit 303.

Figure 3E:
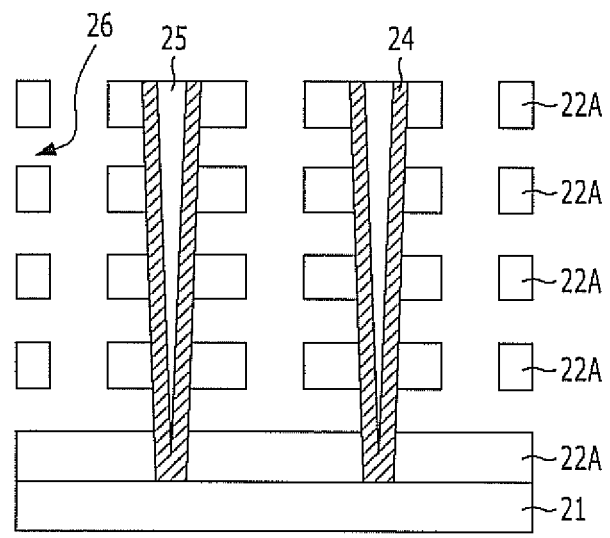

Referring to FIG. 3E, the sacrificial patterns 23A are selectively removed. As a result of the removal of the sacrificial patterns 23A, first undercuts 26 are formed between the dielectric patterns 22A. If the sacrificial patterns 23A are formed of a nitride layer, a wet etching process may be performed. In particular, a wet etching process using phosphoric acid may be performed. When removing the sacrificial patterns 23A, all of the sacrificial patterns 23A around the channel plug 24 are removed, while the removing width of the sacrificial pattern is controlled in the connection slit 303. Accordingly, in the trimming region, a pattern collapse can be prevented because the sacrificial pattern 23B is left. Hereinafter, the undercuts formed in the trimming region will be referred to as second undercuts 26 (refer to FIGS. 5A and 5B).

Figure 3F:
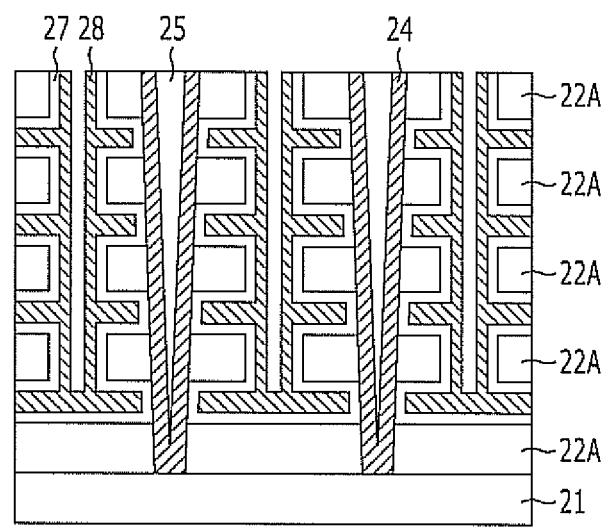

Referring to FIG. 3F, a memory layer 27 is formed on the entire surface including the first and second undercuts 26. The memory layer 27 includes a blocking layer, a charge trapping layer, and a tunnel insulating layer. That is, a blocking layer, a charge trapping layer, and a tunnel insulating layer are sequentially stacked. The blocking layer functions to prevent an electric charge from passing through the charge trapping layer and moving toward a gate electrode. The blocking layer may include an oxide layer that is formed through a thermal oxidation process or a deposition process. The blocking layer may be formed using a material with a high dielectric constant. The charge trapping layer is used as a data storage. The charge trapping layer comprises a charge trapping layer that traps an electric charge at a deep-level trap site. The charge trapping layer may include a nitride layer. Alternatively, the charge trapping layer may be formed using a polysilicon layer. The tunnel insulating layer may include an oxide layer that is formed through a terminal oxidation process or a deposition process. The memory layer 27 includes an ONO structure.

A second conductive layer 28 is formed on the memory layer 27. The second conductive Layer 28 includes a silicon layer. The second conductive layer 28 may be formed of a polysilicon layer or a metal layer. The second conductive layer 28 is used as a word line (or a control gate electrode) of a memory cell.

Figure 3G:
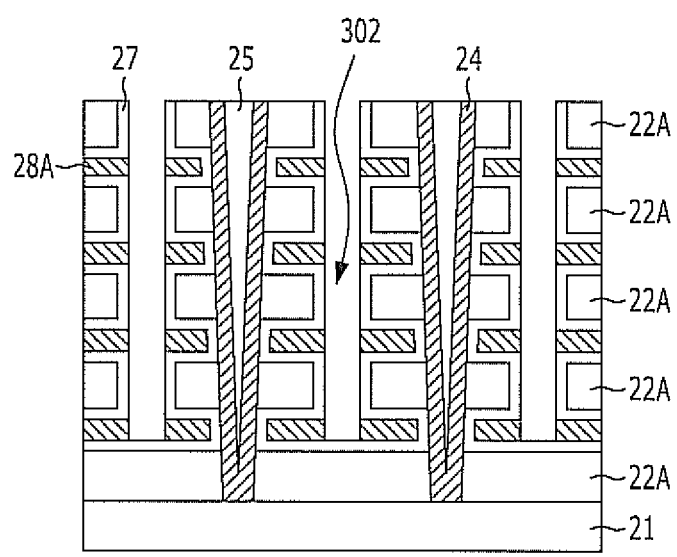

Referring to FIG. 3G, the second conductive layer 28 is selectively isolated to form word lines 28A. The word lines 28A fill the first and second undercuts 26 and surround the channel plug 24. Consequently, the channel plug 24 has the shape of a pillar piercing the word lines 28A, and the memory layer 27 is formed between the channel plug 24 and the word lines 28A. An etch-back process is performed to form the word lines 28A. The use of an etch-back process allows the word lines 28A to be separated. The process of forming the word lines 28A in the undercuts is called a replacement process.

When the word lines 28A are formed, dielectric patterns 22A and word lines 28A are stacked alternately in the vertical direction. Accordingly, a memory string, having memory cells connected in series in the vertical direction, is formed.

A plurality of word line extension portions 28C are formed in a connection slit 303 (refer to FIGS. 4B, 6A and 6B). The word line extension portions 28C extend in one direction (e.g., in a perpendicular direction) from the word line connection portions 28B, which connect the ends of the word lines 28A in a common layer. Accordingly, the number of word line extension portions 28C corresponds to the number of layers of stacked word lines 28A. The word line extension portions 28C are also stacked in the vertical direction like the word lines 28A. In addition, the word line extension portions 28C form a stepwise structure in which the length of the word line extension portions 28C decreases from a lowermost word line extension portion to an uppermost word line extension portion. That is, a step portion ST is provided such that the positions of the ends of the word line extension portions 28C in the trimming region 202 are different from each other.

The width of the word line extension portion 28C may be larger than the interval between the word lines 28A formed in the cell region.

Due to the characteristics of the replacement process, the word line extension portions 28C formed in the trimming region 202 have two connection lines extending from each of the word line connection portions 28B. Further, the number of lines may increase to prevent patterns from collapsing.

A mask process and an etching process are performed to isolate a select transistor gate line. The contact hole formed on a select transistor is formed at the end of the select transistor gate line.

Subsequently, an integration process is performed. For example, a plurality of word line contacts 305 are formed (refer to FIGS. 4C and 6C).

The present invention is also applicable to a structure in which dielectric layers and word lines are stacked alternately in a vertical direction.

Figure 7A:
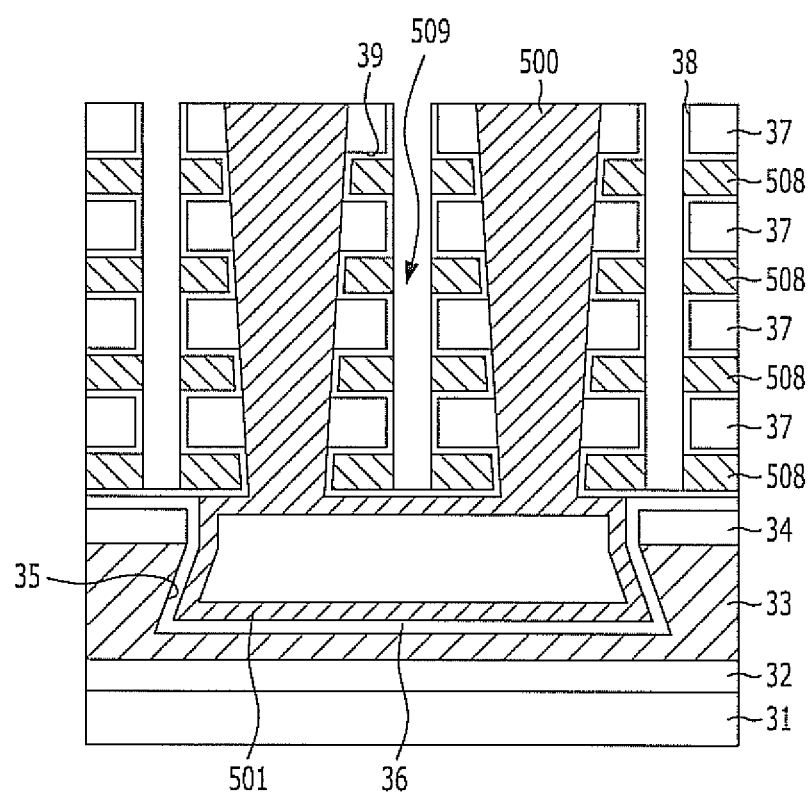
FIG. 7A is a cross-sectional view of a nonvolatile memory device in accordance with a second exemplary embodiment of the present invention.
Figure 7B:
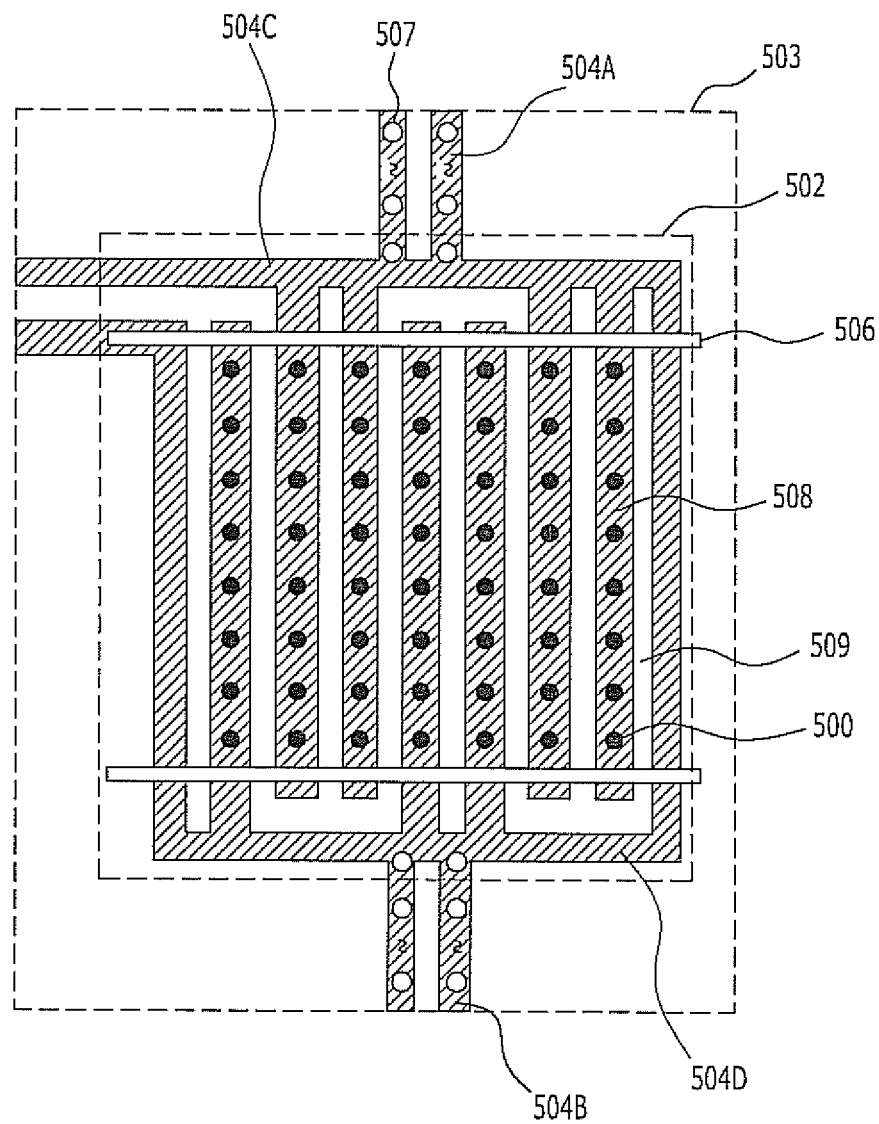
FIG. 7B is a layout view of FIG. 7A.
Figure 7C:
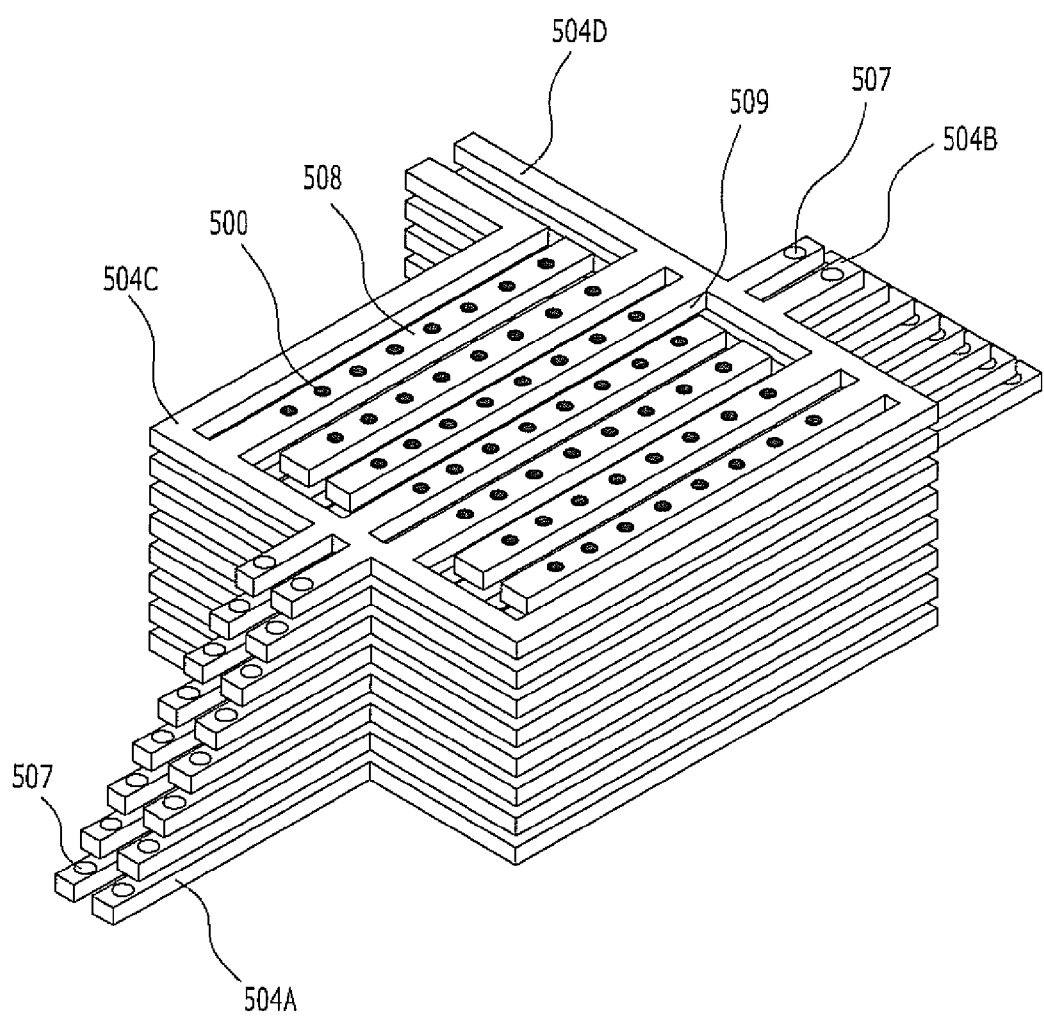
FIG. 7C is a perspective view of a word line and a word line extension portion in accordance with a second exemplary embodiment of the present invention.
Figure 7D:
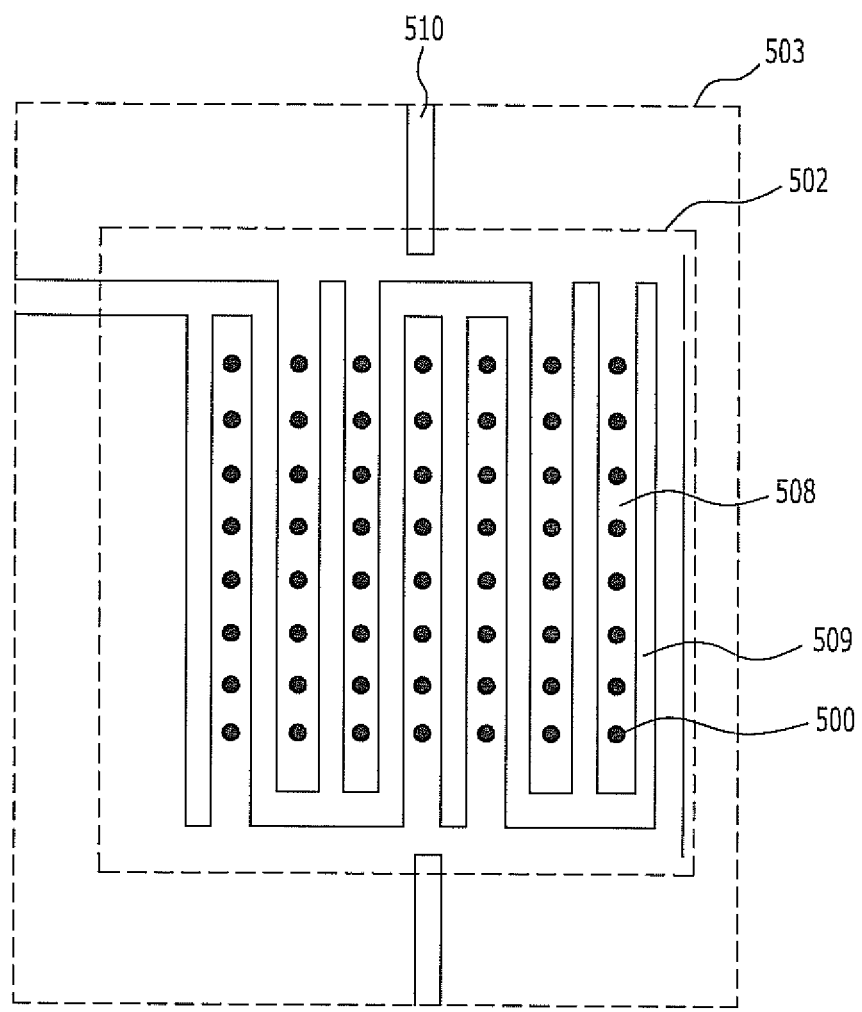
FIG. 7D is a layout view of forming a connection slit in accordance with the second exemplary embodiment of the present invention.

FIG. 7A is a cross-sectional view of a nonvolatile memory device in accordance with a second exemplary embodiment of the present invention. FIG. 7B is a layout view of FIG. 7A. FIG. 7C is a perspective view of a word line and a connection line in accordance with the second exemplary embodiment of the present invention. FIG. 7D is a layout view of forming a connection slit in accordance with the second exemplary embodiment of the present invention.

Referring to FIGS. 7A to 7D, a pair of channel plugs 500 extend in a vertical direction with respect to a substrate 31. A pipe channel 501 connects the bottom portions of the channel plugs 500. A pipe gate 33 surrounds the bottom portions of the channel plugs 500. Word lines 508 surround the channel plugs 500. Word lines 508 surrounding different channel plugs 500 are isolated by a slit 509.

The substrate 31 may include a silicon substrate. A first dielectric layer 32 is formed between the substrate 31 and the pipe gate 33, and a second dielectric layer 34 is formed over the pipe gate 33. The pipe gate 33 has a pipe channel hole 35. A pipe gate insulating layer 36 is formed between the pipe gate 33 and the pipe channel 501.

The channel plug 500 and the pipe channel 501 are formed of the same material. For example, the channel plug 500 and the pipe channel 501 may include a polysilicon layer, and in particular, may be formed of an undoped polysilicon layer. The channel plug 500 and the pipe channel 501 together have a U-shaped structure.

The channel plug 500 is surrounded by word lines 508 and third dielectric layers 37 that are stacked alternately. The sidewalls of the channel plug 500 are surrounded by a memory layer 38. The memory layer 38 includes a blocking layer, a charge trapping layer, and a tunnel insulating layer. The word line 508 is buried in an undercut 39 between the third dielectric layers 37, which are stacked in the vertical direction.

Two memory strings are formed by a slit 509. A pipe channel transistor (PCTR) is formed by the pipe gate 33 and the pipe channel 501. The two memory strings are connected to the pipe channel transistor (PCTR). Consequently, the two memory strings constitute memory cell strings that are connected in series through the pipe channel transistor (PCTR). For example, where four memory cells are formed in each memory string, one memory cell string includes eight memory cells.

Referring to FIGS. 7B and 7C, columnar channel plugs 500 are formed on the substrate. A first word line connection portion 504C is formed to connect the ends of some of the word lines 508. A plurality of first word line extension portions 504A, having a stepwise configuration, are formed to extend from the first word line connection portion 504C. A second word line connection portion 504D is formed to connect the ends of the other word lines 508. A plurality of second word line extension portions 504B, having a stepwise configuration, are formed to extend from the second word line connection portion 504D. A plurality of support layers (not illustrated) are formed between dielectric layers to contact the first and second word line extension portions 504A and 504B. The first word line extension portions 504A and the second word line extension portions 504B are formed in the undercuts through the connection slit 510 illustrated in FIG. 7D.

A plurality of word line contacts 507 are disposed on the first and second word line extension portions 504A and 504B.

Figure 7E:
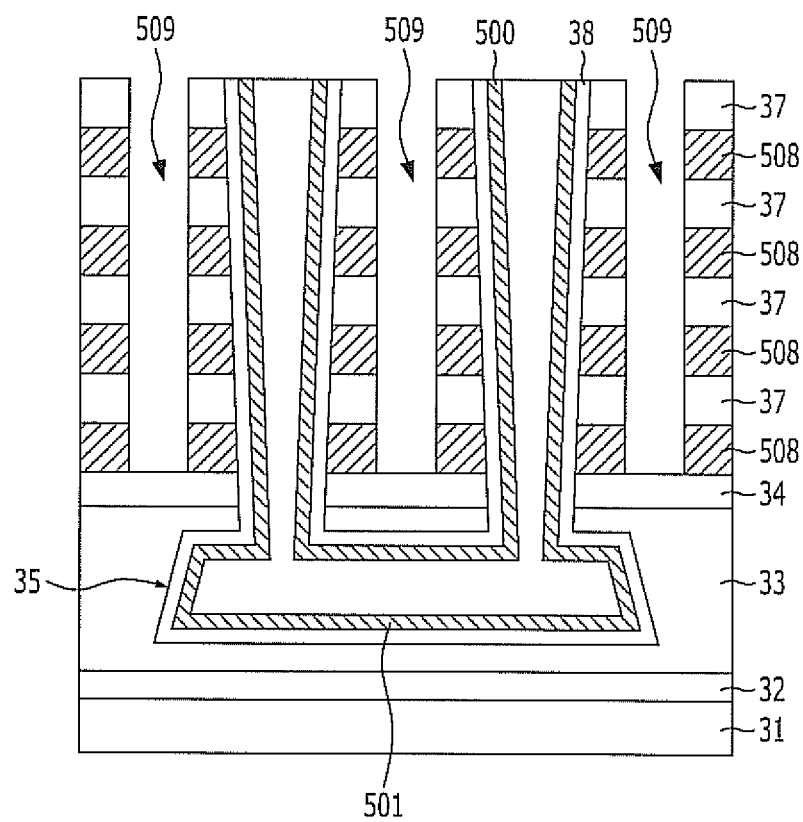
FIG. 7E is a cross-sectional view of a nonvolatile memory device in accordance with a modification of the second exemplary embodiment of the present invention.

FIG. 7E is a cross-sectional view of a nonvolatile memory device in accordance with a modification of a second exemplary embodiment of the present invention.

Referring to FIG. 7E, unlike the structure of FIG. 7A in which the word lines 508 are buried in the undercut between the third dielectric layers 37, a cell channel hole is formed to isolate the word lines 508, and a channel plug 500 and a memory layer 38 are formed in the cell channel hole. That is, conductive layers (e.g., polysilicon layers) used as the word lines 508 are stacked, and the stack structure is etched to form a cell channel hole. A memory layer 38 and a channel plug 500 are formed in the cell channel hole, and a slit 509 is formed to isolate the word lines 508.

Also, like the resulting structure of FIG. 7E illustrating a modification of the second exemplary embodiment, the present invention may stack second dielectric layers 37 and sacrificial layers (not illustrated) alternately with a memory layer 38 and a channel plug 500 disposed therebetween, and may form word lines 508 in the space cleared of the sacrificial layers.

The layout of a modification of the second exemplary embodiment illustrated in FIG. 7E is substantially identical to the layout illustrated in FIG. 7B.

Figure 8A:
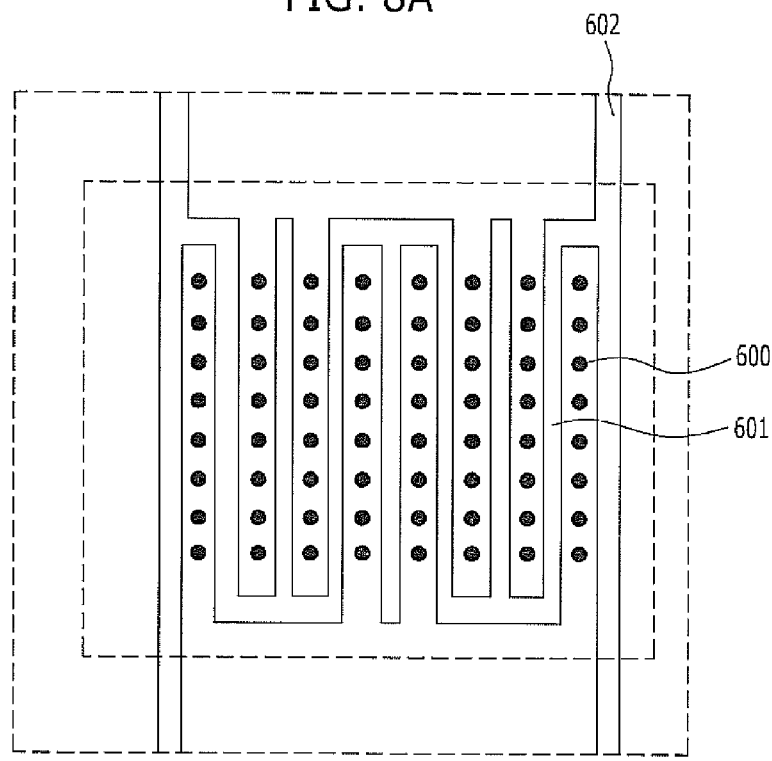
FIGS. 8A and 8B are layout views of a nonvolatile memory device in accordance with a third exemplary embodiment of the present invention.
Figure 8B:
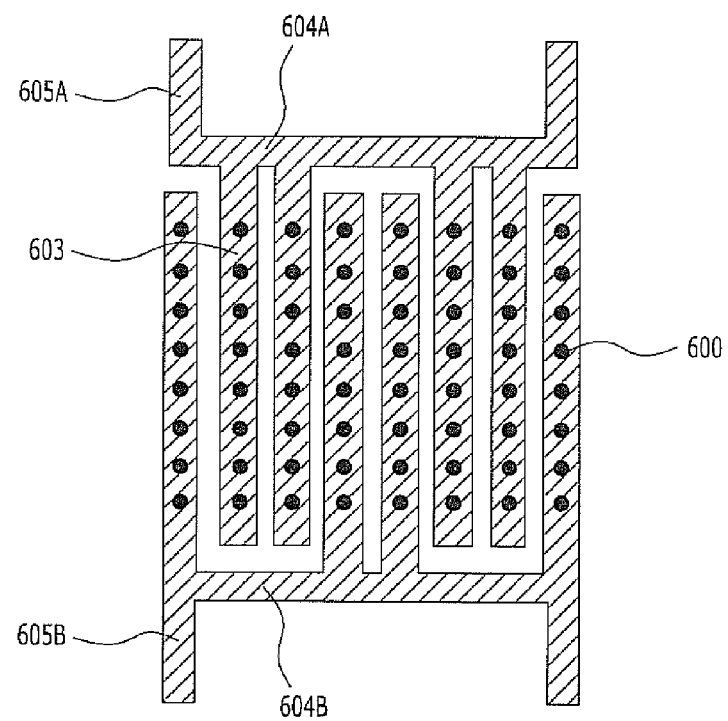
Figure 8C:
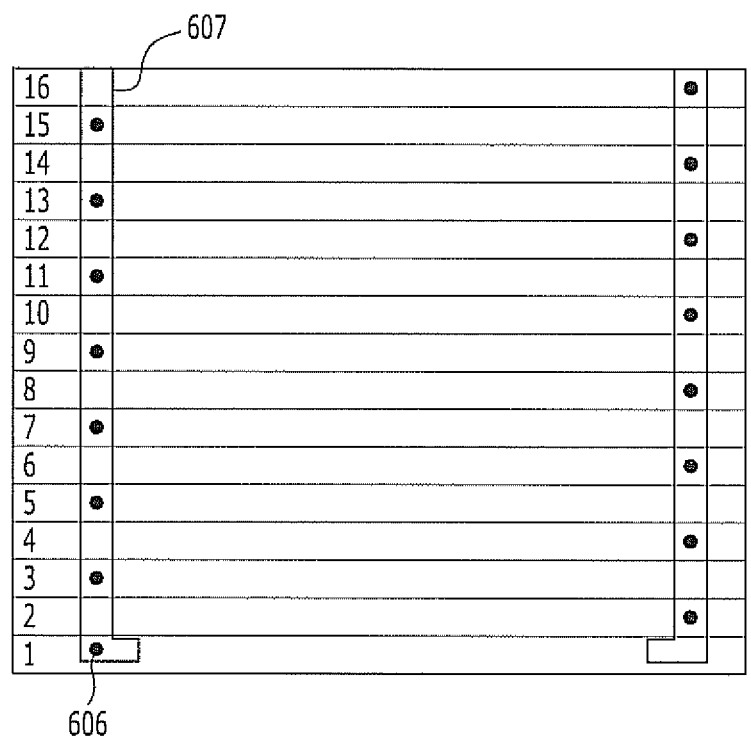
FIG. 8C is a layout view of a word line contact in accordance with a third exemplary embodiment of the present invention.

FIGS. 8A and 8B are layout views of a nonvolatile memory device in accordance with a third exemplary embodiment of the present invention. FIG. 8C is a layout view of a word line contact in accordance with a third exemplary embodiment of the present invention.

Referring to FIGS. 8A and 8B, a plurality of word lines 603 surrounding a plurality of channel plugs 600 are formed. The plurality of word lines 603 extending in the row direction are isolated by a slit 601 and are arranged in the column direction at certain intervals. Layers of the word lines 603 are stacked sequentially from the lowermost layer. The word lines 603 of one layer are connected by word line connection portions 604A and 604B of a corresponding layer. Word line extension portions 605A and 605B extend from both edges of the word line connection portions 604A and 604B. The word line extension portions 605A and 605B are formed in undercuts through a connection slit 602. The row-direction length of the word line extension portions 605A and 605B decreases toward the uppermost layer. That is, the ends of the row-direction layers are trimmed to provide a stepwise configuration. Referring to FIG. 8C, a plurality of word line contacts 606 are disposed at the word line extension portions 605A and 605B. A reference numeral '607' denotes a metal interconnection.

Figure 9A:
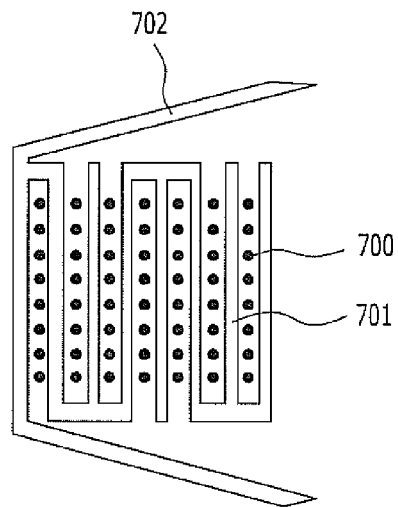
FIGS. 9A and 9B are layout views of a nonvolatile memory device in accordance with a fourth exemplary embodiment of the present invention.
Figure 9B:
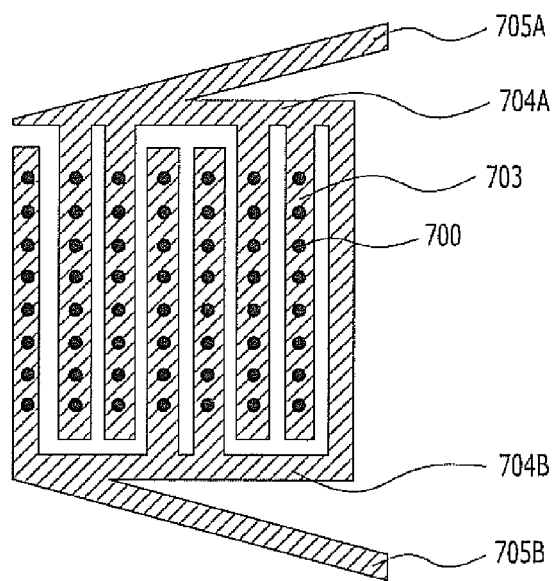
Figure 9C:
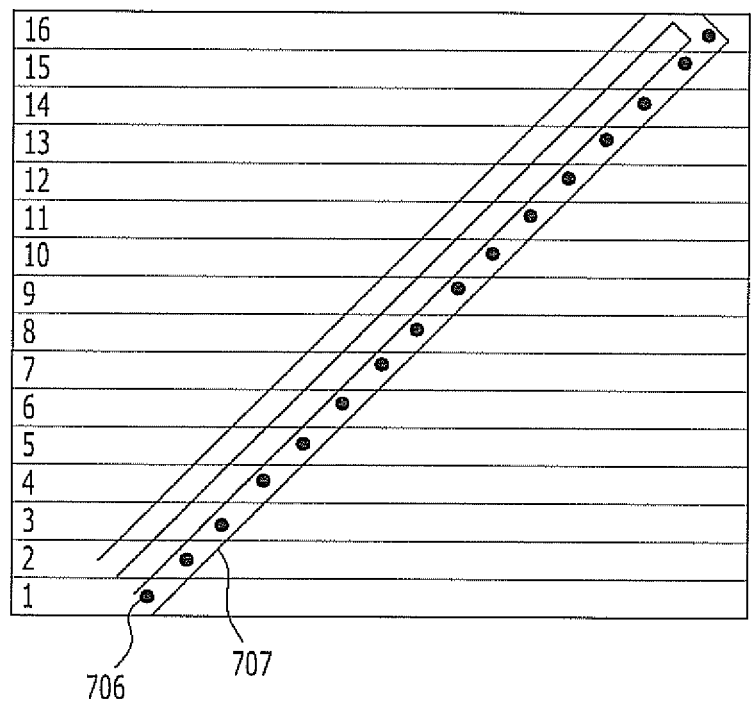
FIG. 9C is a layout view of a word line contact in accordance with the fourth exemplary embodiment of the present invention.

FIGS. 9A and 9B are layout views of a nonvolatile memory device in accordance with a fourth exemplary embodiment of the present invention. FIG. 9C is a layout view of a word line contact in accordance with the fourth exemplary embodiment of the present invention.

Referring to FIGS. 9A and 9B, a plurality of word lines 703 surrounding channel plugs 700 are formed. The plurality of word lines 703 extending in the row direction are isolated by a slit 701 and are arranged in the column direction at certain intervals. Layers of the word lines 703 are stacked sequentially from the lowermost layer. The word lines 703 of one layer are connected by word line connection portions 704A and 704B of a corresponding layer. Word line extension portions 705A and 705B extend from one edge of the word line connection portions 704A and 704B in an oblique direction. The word line extension portions 705A and 705B are formed in undercuts through a connection slit 702. The row-direction length of the word line extension portions 705A and 705B decreases toward the uppermost layer. That is, the ends of the row-direction layers are trimmed to provide a stepwise configuration. Referring to FIG. 9C, a plurality of word line contacts 706 are disposed on the word line extension portions 705A and 705B. A reference numeral '707' denotes a metal interconnection.

Figure 10A:
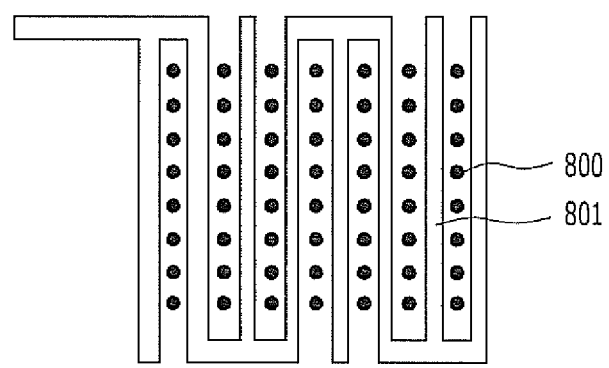
FIGS. 10A and 10B are layout views of a nonvolatile memory device in accordance with a fifth exemplary embodiment of the present invention.
Figure 10B:
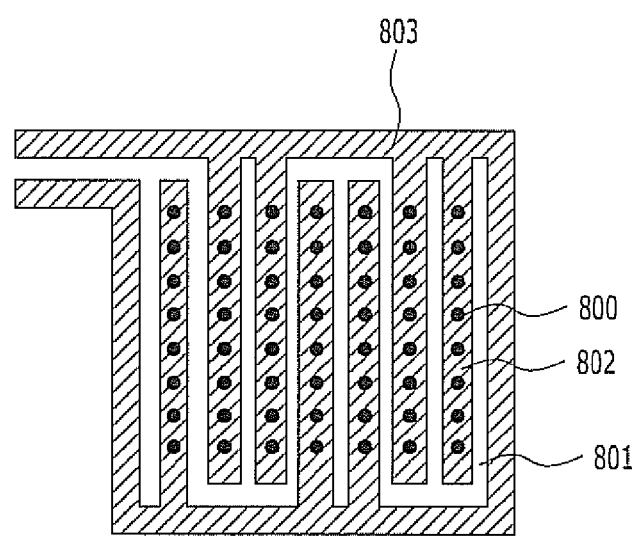
Figure 10C:
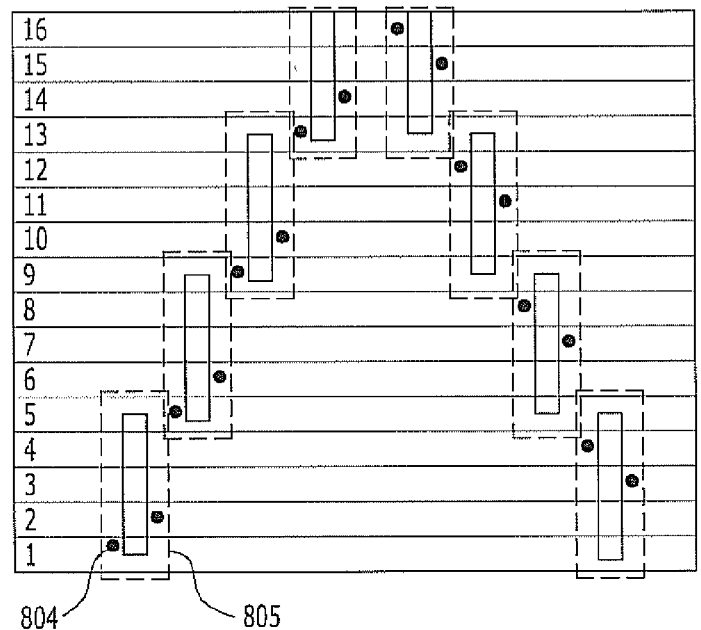
FIGS. 10C and 10D are layout views of a word line contact in accordance with the fifth exemplary embodiment of the present invention.
Figure 10D:
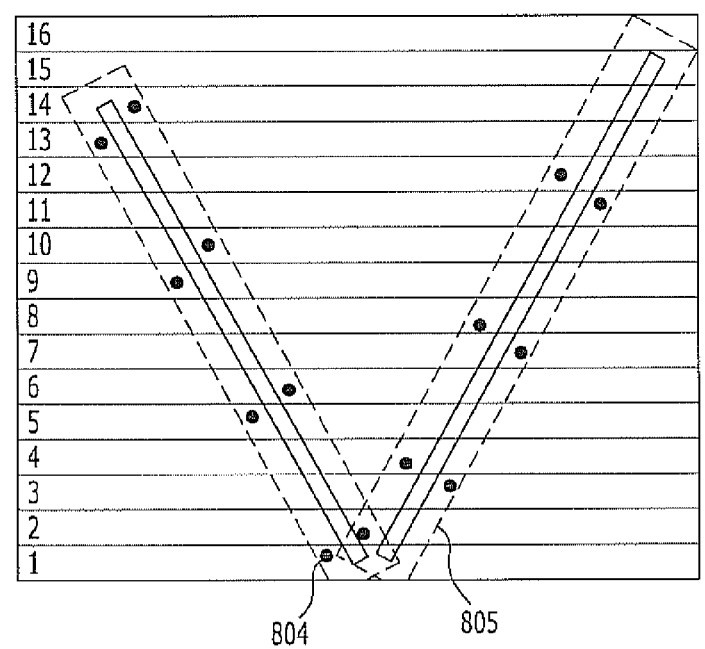

FIGS. 10A and 10B are layout views of a nonvolatile memory device in accordance with a fifth exemplary embodiment of the present invention. FIGS. 10C and 10D are layout views of a word line contact in accordance with the fifth exemplary embodiment of the present invention.

Referring to FIGS. 10A and 10B, a plurality of word lines 802 surrounding channel plugs 800 are formed. A plurality of word lines 802 extending in the row direction are isolated by a slit 801 and are arranged in the column direction at certain intervals. Layers of the word lines 802 are stacked sequentially from the lowermost layer. The word lines 802 of one layer are connected by a word line connection portion 803 of a corresponding layer. The row-direction length of one end of the word line connection portion 803 decreases toward the uppermost layer. That is, the ends of the row-direction layers are trimmed to provide a stepwise configuration. Referring to FIG. 10C, a plurality of word line contacts 804 are disposed at one end of the word line connection portion 803. A reference numeral '805' denotes a metal interconnection.

The word line contact of the fifth embodiment may also have a layout illustrated in FIG. 10D.

Figure 11A:
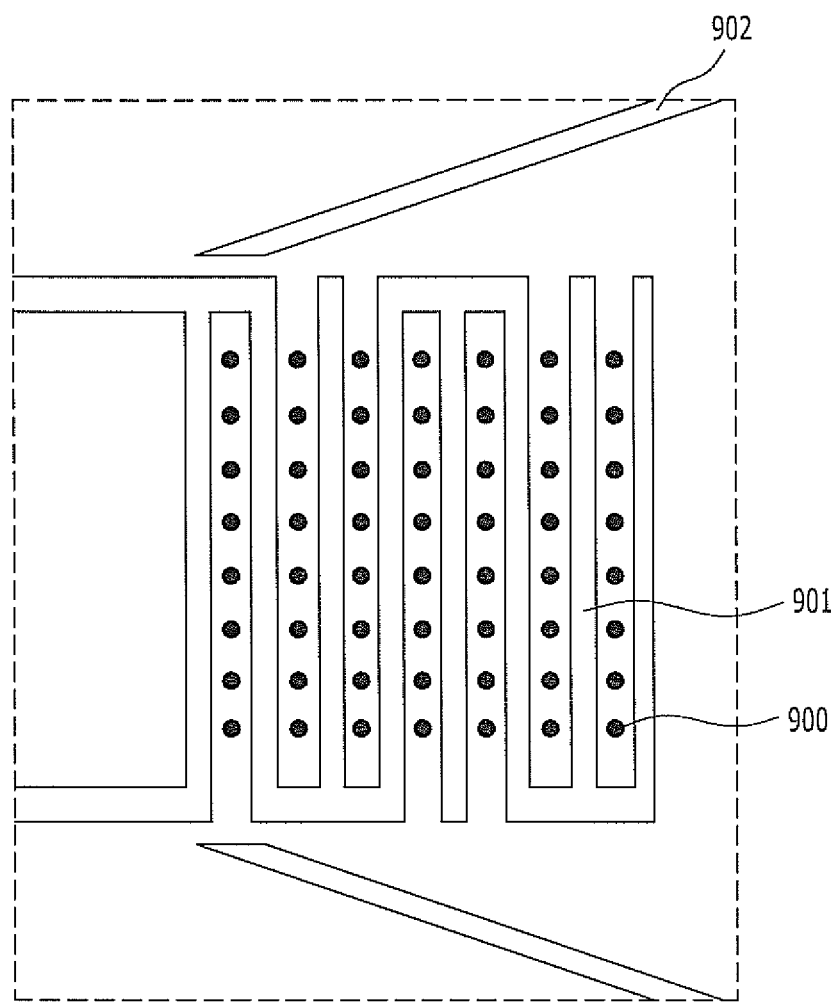
FIGS. 11A and 11B are layout views of a nonvolatile memory device in accordance with a sixth exemplary embodiment of the present invention.
Figure 11B:
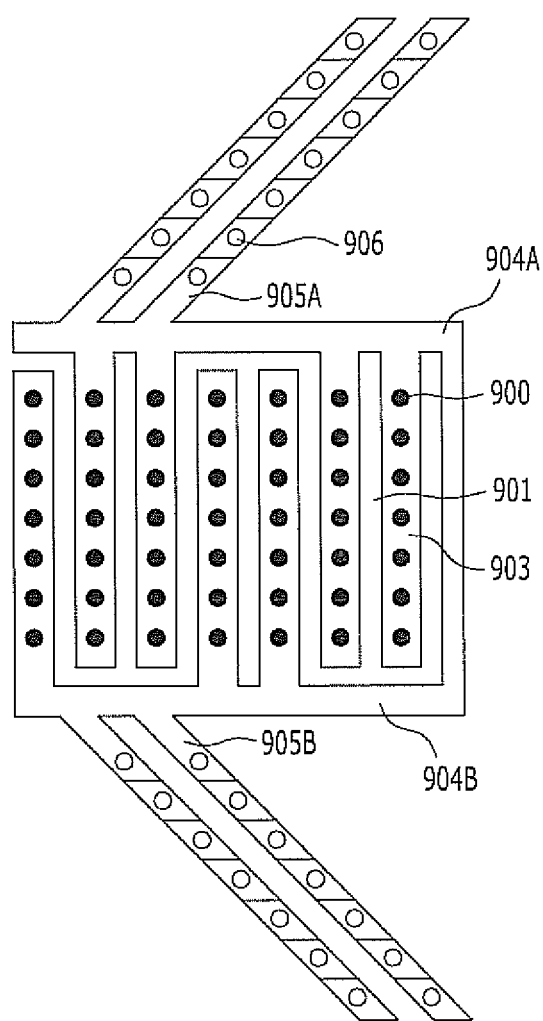
Figure 11C:
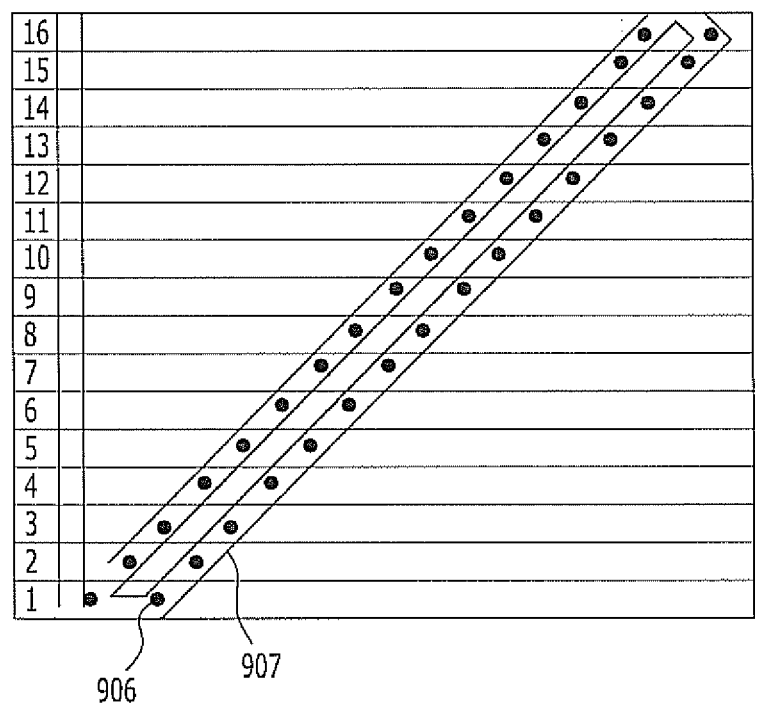
FIG. 11C is a layout view of a word line contact in accordance with the sixth exemplary embodiment of the present invention.

FIGS. 11A and 11B are layout views of a nonvolatile memory device in accordance with a sixth exemplary embodiment of the present invention. FIG. 11C is a layout view of a word line contact in accordance with the sixth exemplary embodiment of the present invention.

Referring to FIGS. 11A and 11B, a plurality of word lines 903 surrounding channel plugs 900 are formed. A plurality of word lines 903 extending in the row direction are isolated by a slit 901 and are arranged in the column direction at certain intervals. A first word line connection portion 904A is formed to connect the ends of some of the word lines 903, and a first word line extension portion 905A is formed to extend in an oblique direction from the first word line connection portion 904A and have a stepwise configuration. A second word line connection portion 904B is formed to connect the ends of the other word lines 903, and a second word line extension portion 905B is formed to extend in an oblique direction from the second word line connection portion 904B and have a stepwise configuration. The word line extension portions 905A and 905B are formed in undercuts through a connection slit 902. A plurality of support layers (not illustrated) are formed between dielectric layers to contact the first and second word line extension portions 905A and 905B. Referring to FIG. 11C, a plurality of word line contacts 906 are disposed at the first and second word line extension portions 905A and 905B. A reference numeral '907' denotes a metal interconnection.

As described above, the present invention can strip the sacrificial layer of the trimming region, which is vulnerable to collapse, only as much as is needed, thus making it possible to improve the structural stability of a three-dimensional nonvolatile memory device.

Also, the present invention can increase the width of the connection line more than the spacing distance between the word lines formed in the cell region, thus making it possible to provide an advantage in terms of the pattern alignment with the word line contact and to improve the mass productivity.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   one or more columnar channel plugs;
   a plurality of word lines arranged in a plurality of common layers;
   a plurality of dielectric layers alternately stacked with the plurality of word lines, wherein the plurality of dielectric layers and the plurality of word lines surround the one or more columnar channel plugs;
   a memory layer disposed between each word line of the plurality of word lines and the one or more columnar channel plugs;
   a plurality of word line connection portions, each word line connection portion, of the plurality of word line connection portions, connecting ends of word lines of a single corresponding common layer of the plurality of common layers; and
   a plurality of word line extension portions extending from each of the plurality of word line connection portions.

2. The nonvolatile memory device of claim 1, wherein the plurality of word line extension portions are formed in a stepwise configuration.

3. The nonvolatile memory device of claim 2, wherein the plurality of word line extension portions have variable lengths, which increase from an upper layer to a lower layer.

4. The nonvolatile memory device of claim 1, wherein the plurality of word lines, the plurality of word line connection portions, and the plurality of word line extension portions of a same common layer, of the plurality of common layers, are formed of a same conductive layer.

5. The nonvolatile memory device of claim 1, wherein at least two word line extension portions, of the plurality of word line extension portions, are formed in a same common layer of the plurality of common layers.

6. The nonvolatile memory device of claim 1, wherein each word line extension portion extends in one direction from an approximately center portion of a corresponding word line connection portion of the plurality of word line connection portions.

7. The nonvolatile memory device of claim 1, wherein the plurality of word line extension portions extend from two edges of each word line connection portion, or are spaced apart from the two edges of each word line connection portion of the plurality of word line connection portions.

8. The nonvolatile memory device of claim 1, wherein the plurality of word line extension portions extend in an oblique direction from one edge of each word line connection portion of the plurality of word line connection portions.

9. The nonvolatile memory device of claim 1, wherein the plurality of word line connection portions comprise:
   a first word line connection portion connecting ends of some of the plurality of word lines; and
   a second word line connection portion connecting ends of other ones of the plurality of word lines; and
   wherein the plurality of word line extension portions comprise:
      a plurality of first word line extension portions extending in an oblique direction from the first word line connection portion and having a stepwise configuration; and
      a plurality of second word line extension portions extending in an oblique direction from the second word line connection portion and having a stepwise configuration.

10. The nonvolatile memory device of claim 1, further comprising a plurality of support layers disposed between the plurality of dielectric layers to contact the plurality of word line extension portions.

11. The nonvolatile memory device of claim 10, wherein the plurality of dielectric layers is formed of an oxide, and the plurality of support layers is formed of a nitride.

12. The nonvolatile memory device of claim 1, wherein each word line connection portion, of the plurality of word line connection portions, connects all ends of the plurality of word lines of the single corresponding common layer.

13. The nonvolatile memory device of claim 1, wherein each word line connection portion comprises:
   a first portion connecting ends of some of the plurality of word lines of the single corresponding common layer; and
   a second portion connecting ends of other ones of the plurality of word lines of the single corresponding common layer.

14. The nonvolatile memory device of claim 1, further comprising a word line contact disposed on each word line extension portion of the plurality of word line extension portions.

15. The nonvolatile memory device of claim 1, wherein the channel plugs make a pair, and the nonvolatile memory device further comprises:
   a pipe channel connecting bottom portions of corresponding pairs of the plurality of channel plugs; and
   a pipe gate filling the pipe channel.

16. The nonvolatile memory device of claim 1, wherein a number of the word line extension portions in the single corresponding common layer is less than a number of the word lines in the single corresponding common layer.

* * * * *